United States Patent
Dedic et al.

(10) Patent No.: US 6,320,527 B1
(45) Date of Patent: *Nov. 20, 2001

(54) MIXED-SIGNAL CIRCUITRY AND INTEGRATED CIRCUIT DEVICES

(75) Inventors: Ian Juso Dedic, Northolt; William George John Schofield, Binfield, both of (GB)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,201

(22) Filed: Jan. 8, 1999

(30) Foreign Application Priority Data

Mar. 4, 1998 (GB) .................................. 9804587

(51) Int. Cl.[7] ..................................... H03M 1/66
(52) U.S. Cl. ........................... 341/144; 257/371
(58) Field of Search .................. 341/155, 144, 341/159; 257/371, 372, 355

(56) References Cited

U.S. PATENT DOCUMENTS

| | | | |
|---|---|---|---|
| 4,567,463 | 1/1986 | Naylor | 340/347 |
| 5,017,918 | 5/1991 | Matsusako | 341/118 |
| 5,031,019 | * 7/1991 | Kosaka et al. | 357/43 |
| 5,140,327 | * 8/1992 | Bruce et al. | 341/172 |
| 5,162,800 | * 11/1992 | Ogawara | 341/144 |
| 5,459,349 | * 10/1995 | Kobatake | 257/659 |
| 5,974,578 | * 10/1999 | Mizokawa et al. | 714/727 |
| 5,994,741 | * 11/1999 | Koizumi et al. | 257/355 |

FOREIGN PATENT DOCUMENTS

| | | |
|---|---|---|
| 0 493 607 | 7/1992 | (EP) . |
| 544 164 | 6/1993 | (EP) . |
| 6 077 830 | 3/1994 | (EP) .............................. H03M/1/36 |
| 2 228 381 | 8/1990 | (GB) . |

OTHER PUBLICATIONS

Fujitsu ASIC Advanced Mixed Signal The Complete Solution, Product Overview, pp. 1–10.
Ryherd, Eric, "Don't get Skewed on your next ASIC design", EDN ELECTRICAL DESIGN NEWS, US, Cahners Publishing Co., Newton Massachusetts, vol. 36, No. 18, Sep. 2, 1991, pp. 139–142.
Wietzke, Dr. –Ing. Joachim, "Self–timing fur schnelle synchrone Schaltungen", ELEKTRONIK, vol. 42, No. 16, Aug. 10, 1993, pp. 62–63.
*PATENT ABSTRACTS OF JAPAN*, of JP 03 105968, vol. 015, No. 295 (E–1094), Jul. 26, 1991.
09/137,837
U.S. application No. 09317837, Schofield et al., filed Aug. 21, 1998.

* cited by examiner

*Primary Examiner*—Peguy JeanPierre
(74) *Attorney, Agent, or Firm*—Staas & Halsey LLP

(57) ABSTRACT

A mixed-signal integrated circuit device comprises a digital circuitry portion (DIGITAL) including digital circuitry (10) and an analog circuitry portion (ANALOG) including analog circuitry (14). The digital circuitry produces plural first digital signals (T1–Tn). The analog circuitry produces one or more analog signals (OUTA, OUTB) in dependence upon received second digital signals (TCK1–TCKn). The device also comprises a signal control circuitry portion (LATCH) including signal control circuitry which derives the second digital signals (TCK1–TCKn) from the first digital signals (T1–Tn) and controls the timing of application of the second digital signals to respective inputs of the analog circuitry. To avoid jitter in the second digital signals arising from power supply loading changes, power is supplied independently to each of the circuitry portions (DIGITAL, LATCH and ANALOG).

57 Claims, 11 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

MIXED-SIGNAL CIRCUITRY AND INTEGRATED CIRCUIT DEVICES

BACKGROUND OF THE INVENTION

1. Field of the Invention

The present invention relates to mixed-signal circuitry and integrated circuit devices, for example digital-to-analog converters (DACs). Such circuitry and devices include a mixture of digital circuitry and analog circuitry.

2. Description of the Related Art

FIG. 1 of the accompanying drawings shows parts of a conventional DAC integrated circuit (IC) of the so-called "current-steering" type. The DAC 1 is designed to convert an m-bit digital input word (D1–Dm) into a corresponding analog output signal.

The DAC 1 contains analog circuitry including a plurality (n) of identical current sources $2_1$ to $2_n$, where $n=2^m-1$. Each current source 2 passes a substantially constant current I. The analog circuitry further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by digital circuitry including a binary-thermometer decoder 6. The decoder 6 operates as follows.

When the binary input word D1–Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n×i differential switching circuits $4_{i+1}$ to $4_n$ select their respective second terminals. The analog output signal $V_A-V_B$ is equal to $(2i-n)IR$.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr–1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

However, when it is desired to operate such a DAC at very high speeds (for example 100 MHz or more), it is found that glitches may occur at one or both of the first and second connection lines A and B, producing a momentary error in the DAC analog output signal $V_A-V_B$. These glitches in the analog output signal may be code-dependent and result in harmonic distortion or even non-harmonic spurs in the output spectrum.

The present inventors have investigated the causes of these glitches, and have determined some of the causes to be as follows.

Firstly, the digital circuitry (the binary-thermometer decoder 6 and other digital circuits) is required to switch very quickly and its gate count is quite high. Accordingly, the current consumption of the digital circuitry could be as much as 20 mA per 100 MHz at high operating speeds. This combination of fast switching and high current consumption inevitably introduces a high degree of noise into the power supply lines. Although it has previously been considered to separate the power supplies for the analog circuitry (e.g. the current sources $2_1$ to $2_n$ and differential switching circuits $4_1$ to $4_n$ in FIG. 1) from the power supplies for the digital circuitry, this measure alone is not found to be wholly satisfactory when the highest performance levels are required. In particular, noise arising from the operation of the binary-thermometer decoder 6 can lead to skew in the timing of the changes in the thermometer-coded signals T1 to Tn in response to different changes in the digital input word D1 to Dm. For example, it is estimated that the skew may be several hundreds of picoseconds. This amount of skew causes significant degradation of the performance of the DAC and, moreover, being data-dependent, the degradation is difficult to predict.

Secondly, in order to reduce the skew problem mentioned above, it may be considered to provide a set of latch circuits, corresponding respectively to the thermometer-coded signals T1 to Tn, between the digital circuitry and the analog circuitry, which latches are activated by a common timing signal such that the outputs thereof change simultaneously. However, surprisingly it is found that this measure alone is not wholly effective in removing skew from the thermometer-coded signals. It is found, for example, that data-dependent jitter still remains at the outputs of the latch circuits and that the worst-case jitter increases in approximate proportion to the number of thermometer-coded signals. Thus, with (say) 64 thermometer-coded signals the worst-case jitter may be as much as 20 picoseconds which, when high performance is demanded, is excessively large.

SUMMARY OF THE INVENTION

According to a first aspect of the present invention there is provided a mixed-signal integrated circuit device comprising: a digital circuitry portion including digital circuitry operable to produce one or more first digital signals; an analog circuitry portion including analog circuitry having a plurality of inputs for receiving respective second digital signals and operable to produce one or more analog signals in dependence upon the received second digital signals; a signal control circuitry portion including signal control circuitry connected to the said digital circuitry and the said analog circuitry portion for deriving the said second digital signals from the said first digital signals and for controlling the timing of application of the said second digital signals to the said inputs; and power supply means for supplying power independently to each of the said circuitry portions.

In such a device, the signal control circuitry is affected much less by power-supply noise resulting from switching of the digital circuitry.

Preferably, for example, the said power supply means provide each said circuitry portion with at least one power supply connection path (e.g. a positive supply line VDD or ground GND), extending within the device between that circuitry portion and a power supply terminal of the device, that it is independent of at least one such power supply connection path of each of the other said circuitry portions. The respective power supply connection paths for the positive supplies of each circuitry portion may be separate, with the power supply connection paths for ground being common, or vice versa. All of the power supply connection paths (both for the positive supply line and ground) for the different circuitry portions may be independent of one another within the device. Outside the device it is possible for a single power supply to be used to the various power supply terminals for the different circuitry portions. This arrangement is both convenient and consistent with the objective of providing the maximum distance between the analog circuitry portion (the most sensitive circuitry) and the most noisy circuitry (the digital circuitry).

In one embodiment, the said digital circuitry portion, the said signal control circuitry portion and the said analog circuitry portion are formed in first, second and third areas of the device respectively, at least part of the said second area being located between the said first and third areas.

The said second area may extend around two or more edges of the said third area, for example in a strip. For example, the third area may be an inner, generally square or rectangular area, and the second area may be a u-shaped area extending around three edges of the third area.

The said second area is preferably small as compared to the said first area. Such a small second area will contain only a small amount of circuitry, so that the power consumption thereof can be small. As a result, the amount of noise coupled from the signal control circuitry to the analog circuitry can be kept desirably low.

The said second and third areas are preferably close together. The said second area is ideally further from the said first area than from the said third area.

In this way the more sensitive second and third areas can be separated from the noisy first area. The greater the physical separation the less the resistive coupling through the substrate between the different areas.

In one embodiment the device has a semiconductor substrate of one conductivity type (e.g. P-type). Each said circuitry portion has respective first and second wells formed in the said substrate, the said first well being of the said one conductivity type (P) and the said second well being of the other conductivity type (N). The said first and second wells of the said digital circuitry portion are located side-by-side in the said substrate and a first power supply line (e.g. GND) of that circuitry portion is connected to the said substrate. For each of the said signal control circuitry portion and the said analog circuitry portion, the said first well is contained wholly within the said second well and is connected to a first power supply line (GND) of the circuitry portion concerned. For each said circuitry portion, the said second well is connected to a second power supply line (VDD) of the circuitry portion concerned. Such a device can be implemented using a so-called "triple well" process and provides excellent isolation between the different circuitry portions. The cost of such a device is expected to be small.

In another embodiment the device has a semiconductor substrate of one conductivity type (e.g. P) and also has, below and preferably close to the substrate surface, a layer of insulating material. The said substrate is divided by isolation means into respective first, second and third substrate regions corresponding respectively to the said digital circuitry portion, the said signal control circuitry portion and the said analog circuitry portion. Each said substrate region has first and second wells formed side-by-side therein, the first well being of the said one conductivity type (P) and the said second well (N) being of the other conductivity type for each said circuitry portion, a first power supply line (e.g. GND) of the circuitry portion concerned is connected to the said substrate region corresponding to that circuitry portion and a second power supply line (VDD) of the circuitry portion concerned is connected to the said second well of the said substrate region corresponding to that circuitry portion. Such a silicon-on-insulator (SOI) construction also provides excellent isolation between the different circuitry portions.

The said layer of insulating material is, for example, an oxygen-implanted layer. To avoid problems associated with damage to the substrate from such oxygen-implantation, it is also possible to use a so-called "bonded wafer" construction in which the said layer of insulating material is formed on one main face of a device wafer, and that wafer is bonded to a backing wafer such that the said layer is sandwiched therebetween. This formation process avoids damage because the insulating material can be formed by thermal oxidation, rather than implantation. The said isolation means may be in the form of a trench of insulating material, extending into the substrate from the surface thereof, between two mutually-adjacent ones of the said substrate regions. Preferably, the said trench extends into the substrate as far as the said layer of insulating material so as to maximise the isolation between the different substrate regions.

Alternatively, the said isolation means may include a well of the said one conductivity type extending between two mutually-adjacent ones of the said substrate regions down to the insulating layer. Such wells can be formed more simply (by doping) than the oxide trenches.

It is not essential that the first and second power supply lines be a positive potential and ground. The supply potentials could be a negative potential and ground, and it is even possible to supply one or more of the circuitry portions with a positive potential, a negative potential and ground or other combinations of three or more power supply potentials.

The said digital circuitry may include decoder circuitry, operable to derive the said first digital signals from a digital code word applied thereto, as well as further circuitry for carrying out other digital signal processing. In this case, it is advantageous if the said power supply means are arranged to supply power independently to the said further circuitry and to the said decoder circuitry, for example using separate power supply lines within the device for the decoder circuitry and the further circuitry. In the case of the triple-well construction mentioned above, the decoder circuitry is then placed in a triple-well section between the further circuitry and the signal control circuitry, and the first and second power supply lines of the decoder circuitry are connected to the first and second wells of the decoder circuitry portions respectively. In the case of the SOI and bonded wafer constructions, the decoder circuitry will have its own substrate region between a substrate region for the further circuitry and the substrate region for the signal control circuitry.

The said signal control circuitry is preferably operable to bring about simultaneous application of the said second digital signals to their respective said inputs. However, in other situations, a staggered application of the second digital signals to their respective inputs may be required.

The said first digital signals and/or said second digital signals preferably include thermometer-coded signals, so as to keep the number of transitions in the digital signals concerned desirably low. For example, when the digital code word changes by a value of one, only one of the first digital signals produced by the decoder circuit will change, whatever the code-word initial value. In the case of binary-coded signals, on the other hand, certain code-word changes of one will result in many or all of the digital signals changing.

The said first digital signals and/or said second digital signals include complementary-signal-pairs. In this case, when any of the digital signals concerned changes, its complementary signal undergoes a complementary change, so that the amounts of charge coupled to the substrate by the two signals of the complementary-signal pair cancel one another out for noise purposes.

According to a second aspect of the present invention there is provided mixed-signal circuitry including: digital circuitry operable to produce a plurality of first digital signals; analog circuitry having a plurality of inputs for receiving respective second digital signals and operable to produce one or more analog signals in dependence upon the received second digital signals; and signal control circuitry, interposed between the said digital circuitry and the said analog circuitry, and comprising: a plurality of individual clocked circuits, each connected for receiving one or more of the said first digital signals and also connected for receiving a clock signal and operable to derive from the received first digital signal(s) at least one second digital signal and to apply that derived second digital signal to its said analog-circuitry input at a time determined by the received clock signal; and clock distribution circuitry including a plurality of clock buffer circuits connected in common for receiving a basic timing signal, each such clock buffer circuit being operable to derive from the basic timing signal such a clock signal for application to one or more corresponding ones of the said clocked circuits.

Such mixed-signal circuitry is effective in overcoming the problem of jitter in the second digitals signals arising from the fact that the loading of the clock signal is found to be dependent upon the number of clock circuits which change their respective states from one clock cycle to the next.

Preferably, each clocked circuit has its own individually-corresponding clock buffer circuit for deriving a unique such clock signal for application to that clocked circuit alone. Such a one-to-one correspondence between the clocked circuits and the clock buffer circuits can provide a remarkable (e.g. ten times) reduction in the jitter in the second digital signals.

Each said clock buffer circuit may have respective non-inverting and inverting outputs for applying respective mutually-complementary clock signals to the or each of its said corresponding clocked circuits.

The said signal control circuitry is, for example, operable to bring about simultaneous application of the said second digital signals to their respective said inputs. For example, the clocked circuits may be respective latch circuits.

The said first digital signals and/or said second digital signals may include thermometer-coded signals, and/or complementary-signal-pairs.

According to a third aspect of the present invention, there is provided mixed-signal circuitry including: digital circuitry operable to produce one or more first digital signals; analog circuitry having a plurality of inputs for receiving respective second digital signals and operable to produce one or more analog signals in dependence upon the received second digital signals; and signal control circuitry, interposed between the said digital circuitry and the said analog circuitry, and comprising: a plurality of individual clocked circuits, each connected for receiving one or more of the said first digital signals and also connected for receiving a clock signal and operable to derive from the received first digital signal(s) at least one second digital signal and to apply that derived second digital signal to its said analog-circuitry input at a time determined by the received clock signal; and power supply decoupling means for dividing the said plurality of clocked circuits into a plurality of units, each unit having at least one said clocked circuit of the said plurality, and for decoupling the respective power supplies of the different units from one another.

In such circuitry the power supply decoupling means prevents stepsize-dependent loading of the signal-control-circuitry power supplies from introducing jitter into the second digital signals.

A mixed-signal integrated circuit device embodying the first aspect of the invention or mixed-signal circuitry embodying the second or third aspect of the invention may be (or include) a digital-to-analog converter. For example, in this case the analog circuitry may include a plurality of current sources or current sinks and a plurality of switch circuits connected to the currents source/sinks for performing predetermined switching operations in dependence upon the said second digital signals so as to produce the said one or more analog signals.

DETAILED DESCRIPTION OF THE PREFERRED EMBODIMENTS

Figure 3:
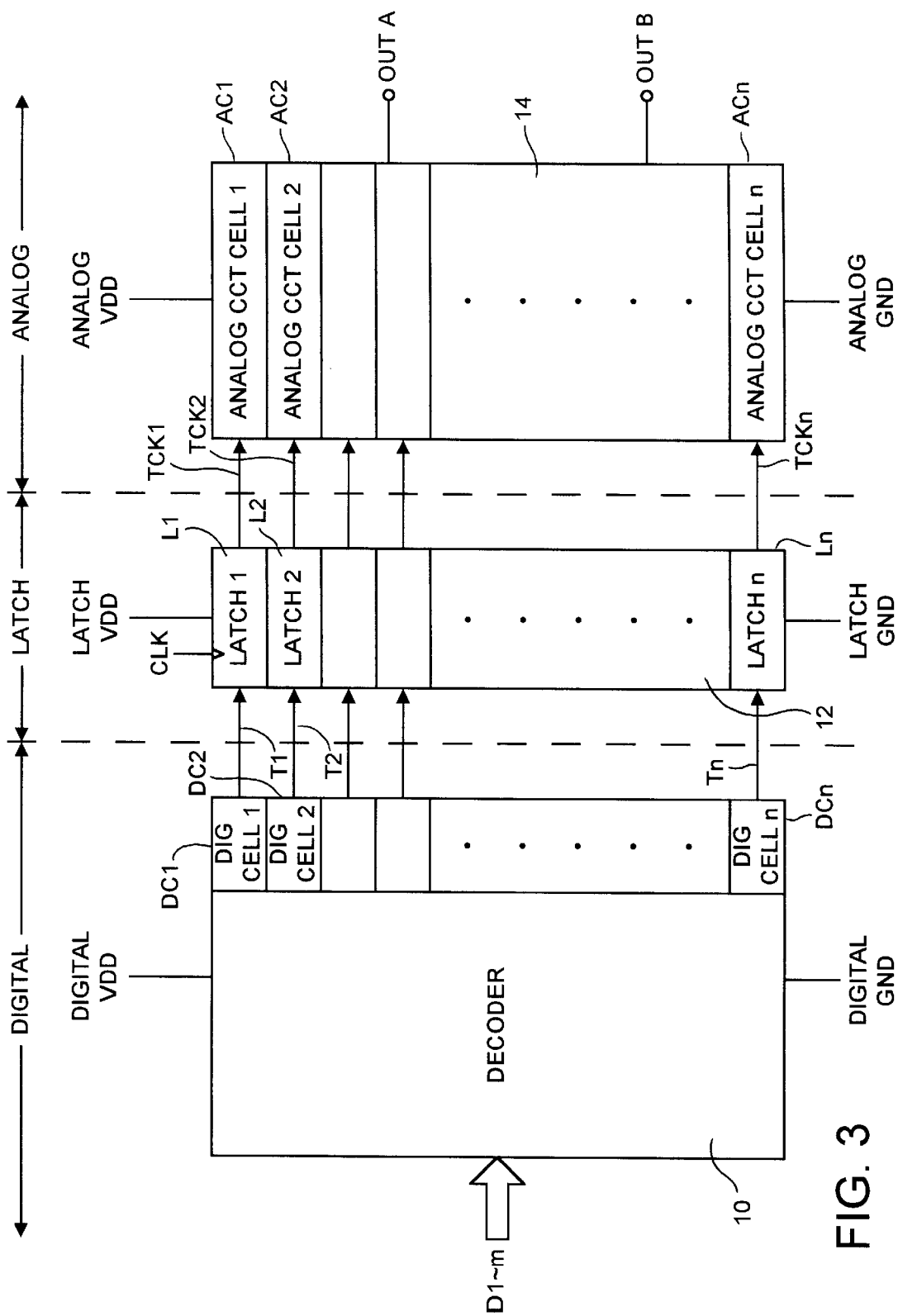
FIG. 3 shows parts of a DAC IC embodying the present invention.

FIG. 3 shows parts of a DAC IC embodying the present invention. The FIG. 3 circuitry is divided into three sections: a digital section, a latch section and an analog section. The latch section is interposed between the digital and analog sections.

Figures 1, 2:
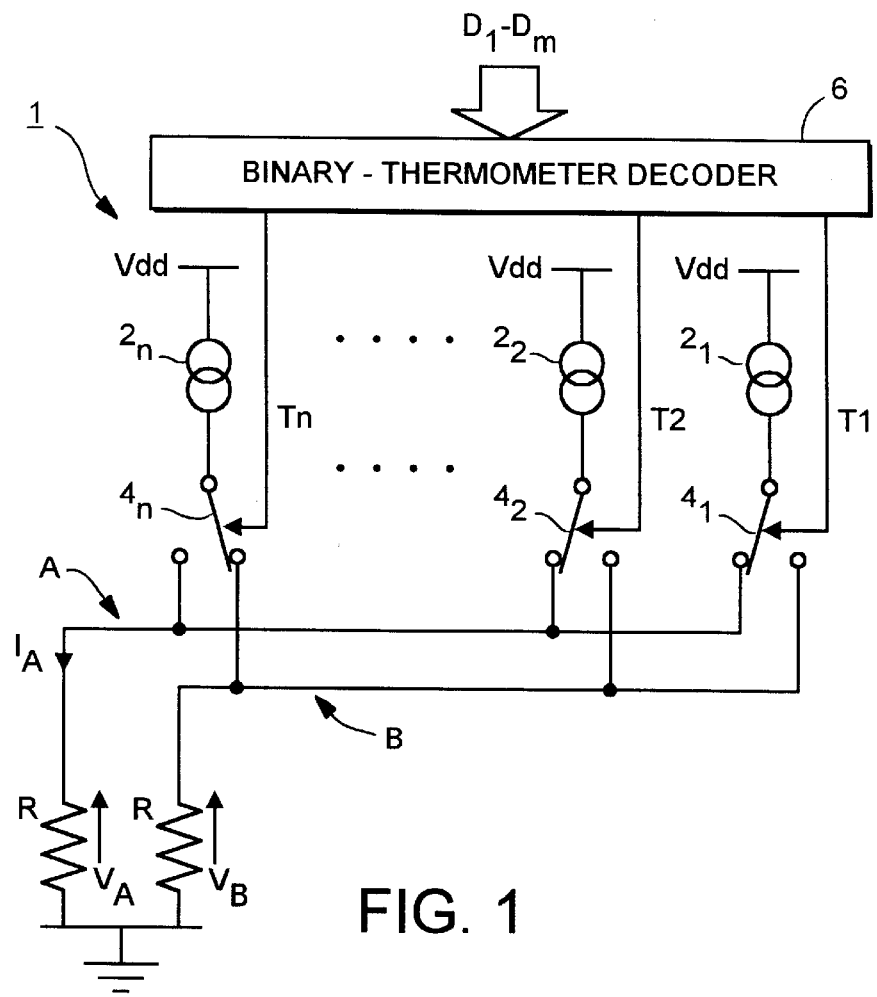
FIG. 1, discussed hereinbefore, shows parts of a conventional DAC IC.
FIG. 2, also discussed hereinbefore, presents a table showing thermometer-coded signals derived from a binary input word.

The digital section comprises decoder circuitry 10, which is connected other digital circuitry (not shown) to receive an m-bit digital input word D1~Dm, The decoder circuitry 10 has an output stage made up of n digital circuits DC1 to DCn which produce respectively thermometer-coded signals T1 to Tn based on the digital input word, for example in accordance with the table of FIG. 2 discussed hereinbefore.

The latch section comprises a set 12 of n latch circuits L1 to Ln. Each latch circuit is connected to receive an individually-corresponding one of the thermometer-coded signals T1 to Tn produced by the decoder circuitry 10. Each latch circuit L1 to Ln also receives a clock signal CLK. The latch circuits L1 to Ln produce at their outputs respective clocked thermometer signals TCK1 to TCKn that correspond respectively to the thermometer-coded signals T1 to Tn produced by the decoder circuitry 10.

In each cycle of the DAC IC a new sample of the digital input word D1~Dm is taken and so the thermometer-coded signals T1 to Tn normally change from one cycle to the next. In each cycle, it inevitably takes a finite time for these signals to settle to their intended final values from the moment the new sample is taken. Also, inevitably some digital circuits DC1 to DCn will produce their respective thermometer-coded signals earlier than others. By virtue of the clocked operation of the latch circuits L1 to Ln, the clocked thermometer signals TCK1 to TCKn can be prevented from changing until all the thermometer-coded signals T1 to Tn have settled to their intended values for a particular cycle of the DAC.

The analog section comprises a set 14 of n analog circuits AC1 to ACn. Each of the analog circuits AC1 to ACn receives an individually-corresponding one of the clocked thermometer signals TCK1 to TCKn. The analog circuits AC1 to ACn each have one or more analog output terminals and signals produced at the analog output terminals are combined appropriately to produce one or more analog output signals. For example, currents may be summed by summing connection lines as in FIG. 1. Two such analog output signals OUTA and OUTB are shown in FIG. 3 by way of example.

In the FIG. 3 circuitry, each digital circuit DC1 to DCn, together with its corresponding latch circuit L1 to Ln and its corresponding analog circuit AC1 to ACn, constitutes a so-called "cell" of the DAC. Thus, each cell includes a digital circuit DC, a latch circuit L and an analog circuit AC. The digital circuit DC produces a first digital signal (thermometer-coded signal) T for its cell. The latch circuit for the cell receives the first digital signal T and delivers to the analog circuit AC of the cell a second digital signal (clocked thermometer signal) TCK corresponding to the first digital signal T once the first digital signals of all cells have settled to their final intended values. Thus, the latch circuit serves as a signal control circuit for deriving the second digital signal from the first digital signal and controlling the timing of its application to the analog circuit AC. The second digital signal TCK serves as a control signal for use in controlling a predetermined operation of the analog circuit AC of the cell. This predetermined operation may be any suitable type of operation of the cell. For example, it could be a switching or selection operation for switching on or off, or controlling the output path of, an analog output signal of the cell. An example of the analog circuit AC of a cell is given later with reference to FIG. 8B.

As shown in FIG. 3, each section of the circuitry (digital, latch and analog) has its own independent power supply connections, for example a positive power supply potential VDD and a negative power supply potential or electrical ground GND. Thus, the digital section has a DIGITAL VDD and a DIGITAL GND; the latch section has a LATCH VDD and a LATCH GND; and the analog section has an ANALOG VDD and ANALOG GND. These different VDD and GND supplies are received at different respective power supply pins of the DAC IC (chip). Thus, if desired the potentials of the supplies to each section can be different from one another. Typically, however, for convenience a single power supply will be used off-chip to provide the power supplies for each of the different sections, and a circuit board on which the chip is mounted will contain suitable circuitry for delivering the different power supplies to the appropriate power supply pins of the chip whilst decoupling the different supplies from one another using inductance and capacitance elements in known manner.

Within the integrated circuit itself, there are a number of ways in which coupling between the power supplies of the three different sections can be prevented.

Figure 4:
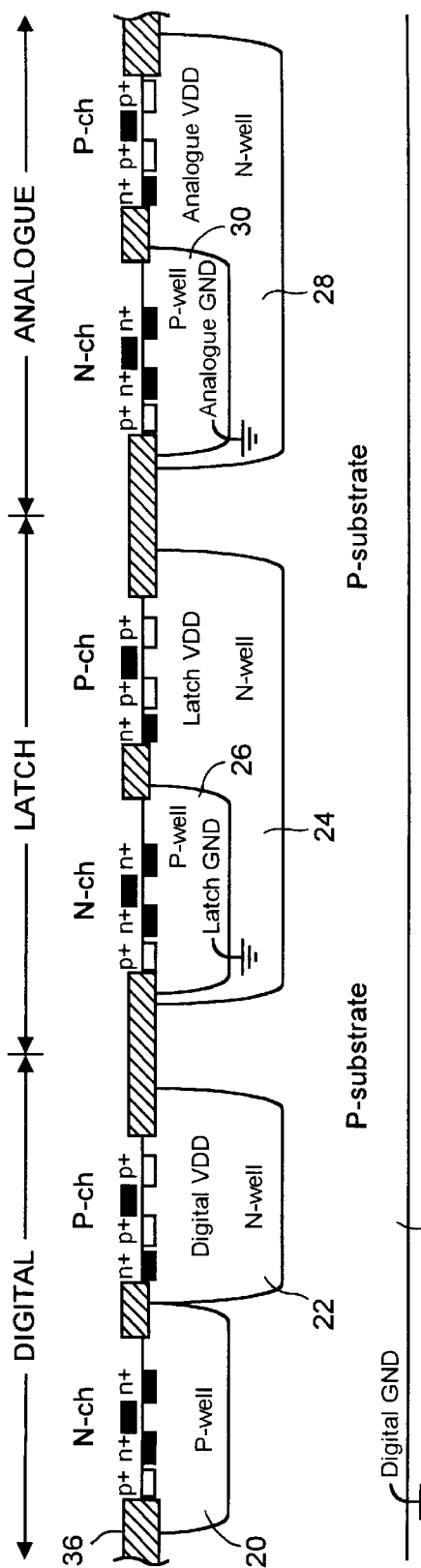
FIG. 4 shows a schematic cross-sectional view of a possible circuit layout on an IC substrate according to a first embodiment of the present invention.

Referring to FIG. 4, in a first embodiment of the present invention, the FIG. 3 circuitry is fabricated on a semiconductor substrate 18 of P-type conductivity. This P-substrate 18 is connected to DIGITAL GND. The digital section of the circuitry is contained in or above respective P-and N-wells 20 and 22, the N-well potential being made equal to DIGITAL VDD.

The latch section also has an N-well 24 and a P-well 26 but, in this case, the P-well 26 is formed wholly within the N-well 24. The N-well 24 isolates the circuitry within/above it from other sections of the chip by the action of reverse bias between the Nwell 24 and the P-substrate 18. The potential of the N-well 24 is set to the latch-section positive supply LATCH VDD, whereas the potential of the P-well 26 is made equal to LATCH GND. The reverse-biased N-well 24 separates the latch-section ground LATCH GND from the digital-section ground DIGITAL GND, so that there is no resistive coupling via the substrate 18. There is only capacitative coupling between the latch-section positive supply LATCH VDD and the digital-section ground DIGITAL GND; this coupling may be in the region of 60 pF/mm$^2$.

Similarly, the analog section has respective N- and P-wells 28 and 30, the P-well 30 being contained entirely within the N-well 28. The potential of the P-well is set to the analog-section ground ANALOG GND, whilst the potential of the N-well 28 is made equal to the analog-section positive supply ANALOG VDD. Again, there is no resistive coupling via the substrate as ANALOG GND is separated from DIGITAL GND by the reverse-biased N-well 28.

Field oxide 36 is used to delimit the active areas of the substrate surface in conventional manner.

The FIG. 4 layout can be achieved using a socalled "triple-well CMOS process", further details of which can be found, for example, in "Advanced Mixed Signal ASIC Product Review", Fujitsu Limited, 1997, pp. 5 and 6, the content of which is incorporated herein by reference.

Figure 5:
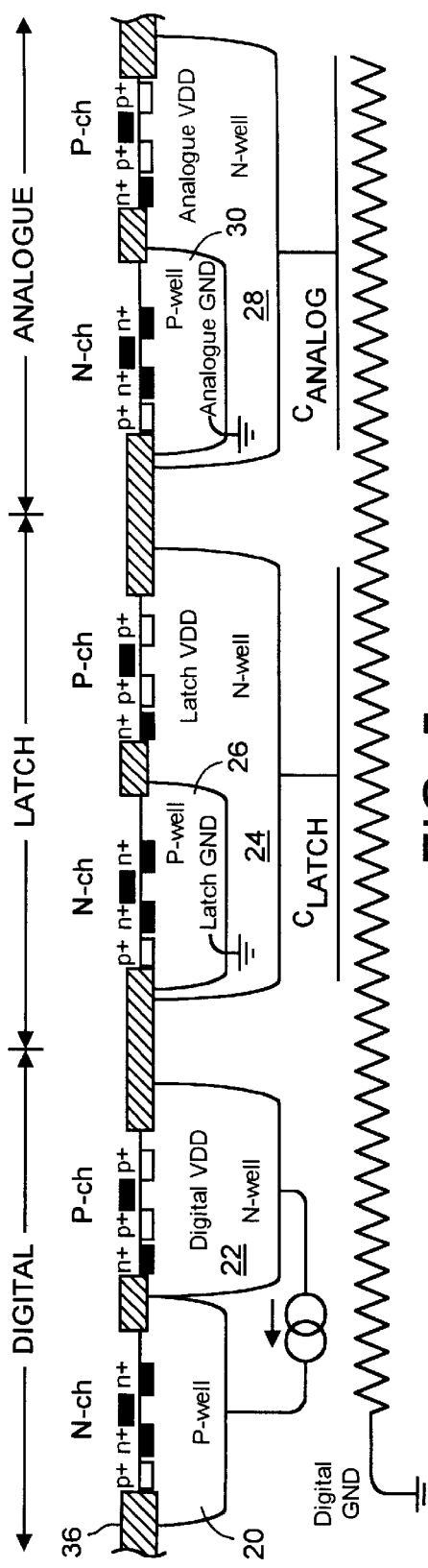
FIG. 5 shows a schematic view corresponding to FIG. 4 for illustrating operation of the first embodiment.

FIG. 5 is a schematic cross sectional view corresponding to FIG. 4. As FIG. 5 shows, the capacitative coupling $C_{LATCH}$ between the latch-section positive supply LATCH VDD and the digital-section ground DIGITAL GND is proportional to the area occupied by the N-well 24 of the latch section. Thus, the area occupied by the N-well 24 is preferably minimised, and accordingly it is desirable to keep the circuitry of the latch section as simple as possible.

It will also be seen that the amount of coupling between the latch-section positive supply LATCH VDD and the digital-section ground DIGITAL GND is influenced by the lateral separation between the N-well 24 of the latch section and the wells 20 and 22 of the digital section. The greater the separation, the less the coupling. However, it will be understood that greater separation means lower integration density inside the chip, so inevitably some design compromise will be required.

As with the N-well 24 of the latch section, the area occupied by the N-well 28 of the analog section influences the degree of capacitative coupling $C_{ANALOG}$ between the analog-section positive supply ANALOG VDD and the digital-section ground DIGITAL GND. The smaller the area the less the capacitative coupling. Furthermore, the greater the separation between the N-well 28 and the two wells 20 and 22 of the digital section the better.

In terms of the amount of noise that can be tolerated on the supply lines, in order of decreasing tolerance the supply lines are DIGITAL VDD, DIGITAL GND, LATCH VDD, LATCH GND, ANALOG VDD and ANALOG GND. It will be seen that the FIG. 4 layout is consistent with these noise tolerance requirements in that it puts the most sensitive supplies ANALOG VDD and ANALOG GND furthest from the digital section which generates the most noise.

It will be seen that in FIG. 4 the P-wells 26 and 30 (which are connected to LATCH GND and ANALOG GND respectively) are positioned within their respective N-wells 24 and 28 on the side closer to the digital section. To further improve the isolation of LATCH GND and ANALOG GND from DIGITAL GND and DIGITAL VDD they could instead be located on the other side of their respective N-wells 24 and 28 so as to maximise the spacing of each of these P-wells from the digital section.

Figure 6:
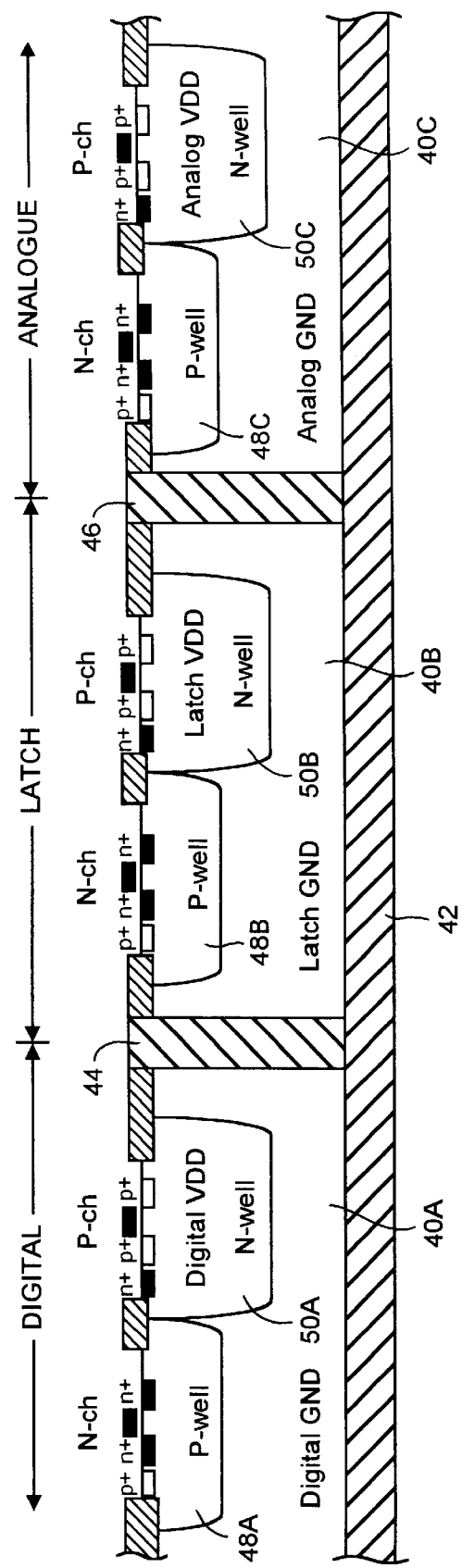
FIG. 6 shows a schematic cross-sectional view of another possible circuit layout on an IC substrate according to a second embodiment of the present invention.

FIG. 6 shows a possible layout of the FIG. 3 circuitry according to a second embodiment of the present invention. The FIG. 6 embodiment has a socalled silicon-on-insulator (SOI) construction in which a substrate of silicon material (P-type in this case) 40 is implanted with high-energy oxygen particles so as to form, a small distance beneath the substrate surface, an implanted layer 42 of silicon dioxide SiO$_2$.

After the formation of the implanted silicon dioxide layer 42, oxide trenches 44 and 46 are formed in the substrate 40, which trenches extend downwards all the way to the implanted silicon dioxide layer 42. Accordingly, the oxide trenches 44 and 46 serve to divide the substrate into three regions 40A, 40B and 40C corresponding respectively to the digital, latch and analog sections of the FIG. 3 circuitry.

Within each substrate region 40A to 40C, P-wells 48A to 48C and N-wells 50A to 50C are formed in conventional manner. In the region 40A corresponding to the digital section, the substrate is connected to digital-section ground DIGITAL GND and the N-well 50A is connected to the digital-section positive supply DIGITAL VDD. In the region 40B corresponding to the latch section, the substrate is connected to the latch-section ground LATCH GND, and the N-well 50B is connected to the latch-section positive supply LATCH VDD. In the region 40C corresponding to the analog section, the substrate is connected to analog-section ground ANALOG GND, and the N-well 50C is connected to the analog-section positive supply ANALOG VDD.

Alternatively, in place of the oxide trenches 44 and 46 it is possible to use wells of opposite conductivity type to the substrate to isolate the different sections. These wells should also extend down as far as the insulating layer 42. The isolation wells can be one and the same wells as the wells 50A to 50C if these extend down to the insulating layer 42.

Figure 7:
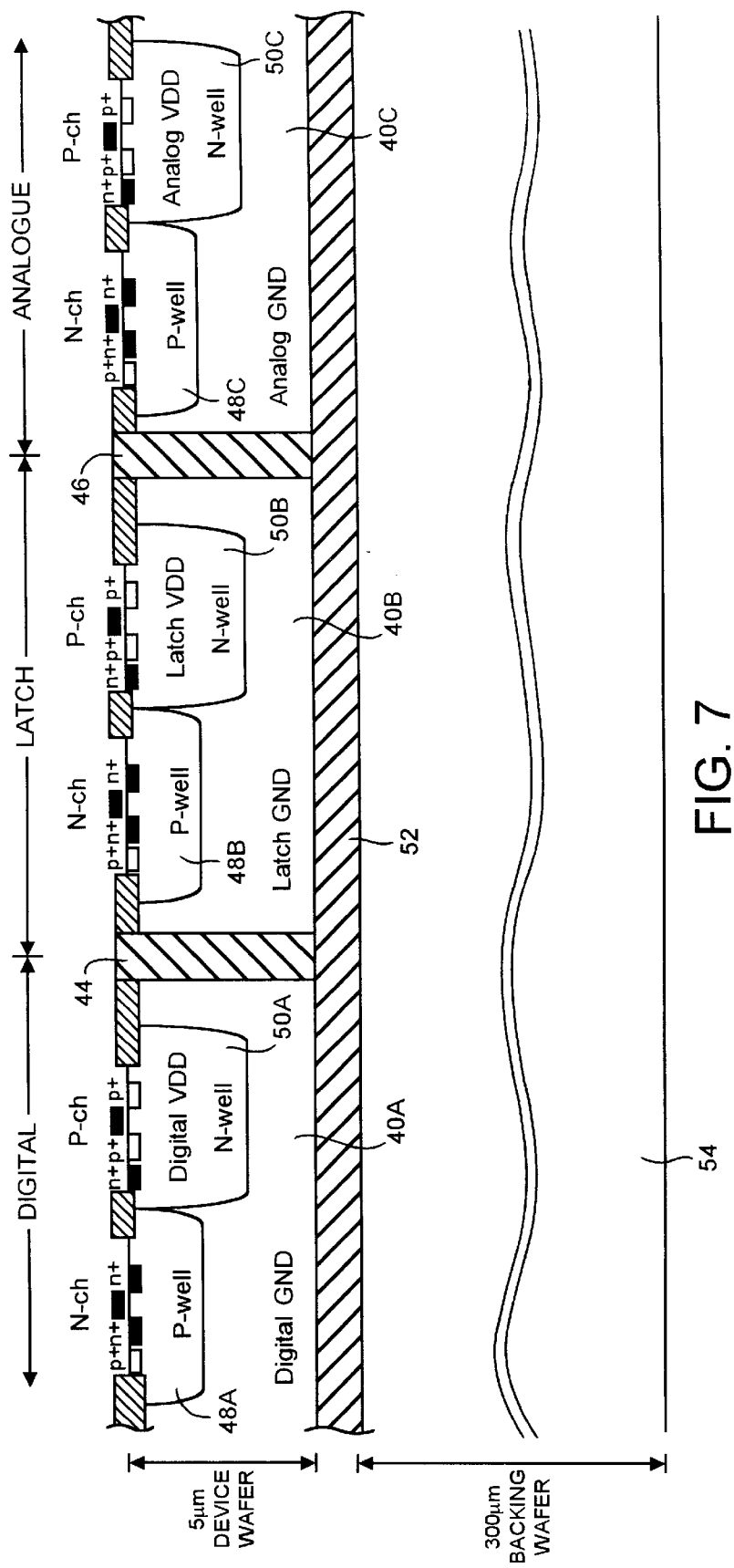
FIG. 7 shows a schematic cross-sectional view of yet another possible circuit layout on an IC substrate according to a third embodiment of the present invention.

FIG. 7 shows another possible layout of the FIG. 3 circuitry based on a so-called bonded wafer construction. One problem that arises with the SOI construction of the FIG. 6 embodiment is associated with damage to the substrate caused by the high-energy oxygen implantation required to form the silicon dioxide layer 42 below the substrate surface. The bonded wafer construction of FIG. 7 avoids this problem by taking a device wafer, of typical initial thickness 300 $\mu$m, and oxidizing the exposed surface thereof to form an oxide layer 52. The device wafer is then bonded to a backing wafer 54, of typical thickness 300 $\mu$m, to form a wafer sandwich in which the oxide layer 52 is located between the device wafer and the backing wafer. After this, the device wafer is reduced in thickness to approximately 5 $\mu$m, and the resulting structure is then processed to form the oxide trenches 44 and 46 and the P-wells 48A to 48C and N-wells 50A to 50C in the conventional manner. Because the bondedwafer construction avoids the oxygen implantation step needed in the SOI construction of FIG. 6, the substrate in the bonded-wafer construction is generally of superior quality as compared to the SOI construction.

In FIGS. 4 to 6, a P-type substrate was used. However, it will be appreciated that an N-type substrate could be used instead, the conductivity types of the wells being reversed accordingly from those already described. In this case, the N-substrate and N-wells are connected to the relevant ground GND and the P-wells are connected to the relevant positive supply VDD.

Figure 8A:
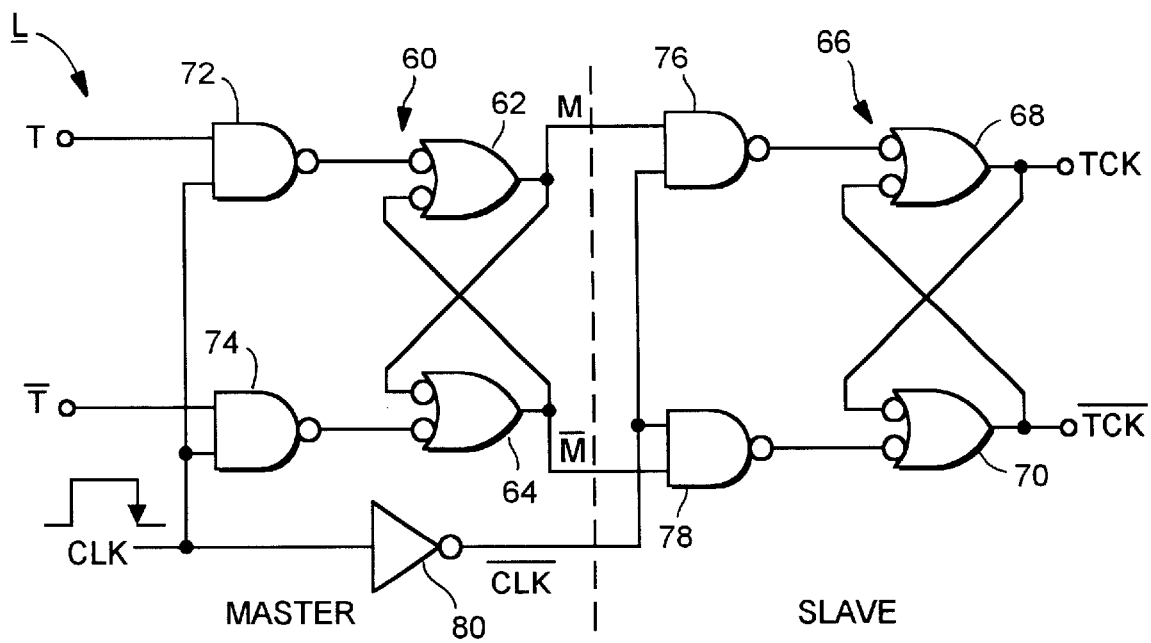
FIG. 8A shows a circuit diagram of a latch circuit suitable for use in a DAC IC embodying the present invention.
Figure 8B:
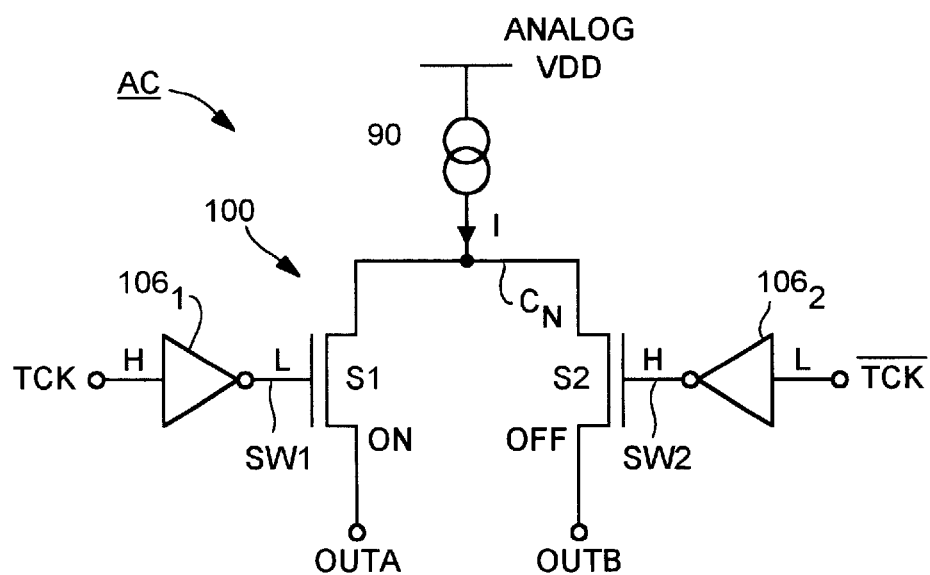
FIG. 8B shows a circuit diagram of an analog circuit suitable for use in a DAC IC embodying the present invention.

FIGS. 8A and 8B show respectively examples of the construction of the latch circuit L and analog circuit AC of one cell of the FIG. 3 circuitry.

The latch circuit L of FIG. 8A is of the differential D-type having (in this example) a master-slave configuration. The FIG. 8A circuit has a master flip-flop 60 made up of NAND gates 62 and 64, and a slave flip-flop 66 made up of NAND gates 68 and 70. NAND gates 72 and 74 each receive at one input thereof a clock signal CLK (FIG. 3). The other inputs of the gates 72 and 74 are connected respectively to T and $\overline{T}$ inputs of the circuit. The T input receives the thermometer-coded signal T produced by the digital circuit DC of the cell concerned. The $\overline{T}$ input is connected to receive a signal $\overline{T}$ complementary to the thermometer-coded signal. Complementary signals T and $\overline{T}$ are used in this embodiment since any change in the signal T is accompanied by a complementary change in the signal $\overline{T}$, which reduces the noise imposed on the power supply lines when the input word changes. If desired, however, the FIG. 8A circuit could be modified to have a single T input, in which case an additional inverter (not shown) would be provided between that single input and the relevant input of the gate 74.

The FIG. 8A circuit also includes NAND gates 76 and 78 connected between outputs M and $\overline{M}$ of the master flip-flop 60 and inputs of the slave flip-flop 66. These gates 76 and 78 receive an inverted version $\overline{CLK}$ of the clock signal CLK produced by an inverter 80. Outputs of the slave flip-flop produce respectively mutually-complementary output signals TCK and $\overline{TCK}$.

In use of the FIG. 8A circuit, when the clock signal CLK is high, the gates 72 and 74 are enabled, forcing the outputs M and $\overline{M}$ of the master flip-flop 60 to the same logic values as the inputs T and T respectively, i.e. M=T and $\overline{M}$=$\overline{T}$. The gates 76 and 78 are disabled, so the slave flip-flop 66 retains its previous state. When the clock signal CLK changes from HIGH to LOW, the inputs to the master flip-flop 60 are disconnected from the T and $\overline{T}$ input signals, whereas the inputs of the slave flip-flop 66 are simultaneously coupled to the outputs M and $\overline{M}$ of the master flip-flop 60. The master flip-flop 60 accordingly transfers its state to the slave flip-flop 66. No further changes can occur in the output signals TCK and $\overline{TCK}$ because the master flip-flop 60 is now effectively disabled. At the next rising edge of the clock signal CLK, the slave flip-flop 66 is decoupled from the master flip-flop 60 and retains its state, whilst the master flip-flop 60 once again follows the input signals T and $\overline{T}$.

Although FIG. 3 shows latch circuitry connecting the digital circuitry to the analog circuitry, this is not essential. Any signal control circuitry can be used so long as it is capable of receiving at least one first digital signal and outputting plural second digital signals derived from the first digital signals such that the timing of application of each second digital signal to the subsequent analog circuitry is well controlled. The first and second digital signals need not be equal in number. For example, the signal control circuitry could have a combinatorial logic function for combining two or more first digital signals to produce one second digital signal. Nor need it necessarily be the case that the second digital signals be applied simultaneously to the different analog-circuitry inputs. In some situations a staggered application of the second digital signals might be required, the times when the different second digital signals are applied to their respective inputs nonetheless requiring careful control.

FIG. 8B shows parts of an exemplary analog circuit AC of one cell of the FIG. 3 circuitry. The analog circuit AC comprises a constant-current source 90 and a differential switching circuit 100. The differential switching circuit 100 comprises first and second PMOS field-effect-transistors (FETs) S1 and S2. The respective sources of the transistors S1 and S2 are connected to a common node CN to which the current source 90 is also connected. The respective drains of the transistors S1 and S2 are connected to respective first and second summing output terminals OUTA and OUTB of the circuit. In this embodiment, the output terminals OUTA of all cells are connected together and the respective output terminals OUTB of the cells are connected together.

Each transistor S1 and S2 has a corresponding driver circuit $106_1$ and $106_2$ connected to its gate. The clocked thermometer signals TCK and $\overline{TCK}$ produced by the latch circuit L of the cell (e.g. FIG. 8A) are applied respectively to inputs of the driver circuits $106_1$ and $106_2$. Each driver circuit buffers and inverts its received input signal TCK or $\overline{TCK}$ to produce a switching signal SW1 or SW2 for its associated transistor S1 or S2 such that, in the steady-state condition, one of the transistors S1 and S2 is on and the other is off. For example, as indicated in FIG. 2 itself, when the input signal TCK has the high level (H) and the input signal $\overline{TCK}$ has the low level (L), the switching signal SW1 (gate drive voltage) for the transistor S1 is at the low level L causing that transistor be ON, whereas the switching signal SW2 (gate drive voltage) for the transistor S2 is at the high level H, causing that transistor to be OFF. Thus, in this condition, all of the current I flowing into the common node CN is passed to the first output terminal OUTA and no current passes to the second output terminal OUTB.

When the input signals TCK and $\overline{TCK}$ undergo complementary changes from the state shown in FIG. 8B, the transistor S1 turns OFF at the same time that the transistor S2 turns ON.

It will be appreciated that many other designs of analog circuit can be used. For example, other differential switching circuits are described in our copending United Kingdom Patent Application No. 9800387.4, and other cell arrays for use in DAC ICs and other mixed-signal ICs are described in our copending United Kingdom patent application no. 9800367.6. The contents of these copending applications are incorporated by reference.

As far as the digital circuits are concerned, any suitable binary-thermometer decoding circuitry can be used. A two-stage decoding process may be used in which a so-called global decoder decodes the input word into two or more sets (or dimensions) of thermometer coded signals (referred to as row and column signals or row, column and depth signals). These two or more sets of signals are delivered to a plurality of local decoders which correspond respectively to the cells. Each local decoder only needs to receive and decode a small number (e.g. two or three) of the signals in the sets produced by the global decoder. These local decoders can be regarded as being arranged logically (not necessarily physically as well) in two or more dimensions corresponding respectively to the sets of thermometer-coded signals. The local decoders are addressed by the sets of the thermometer-coded signals and, using simple combinatorial logic, derive respective "local" thermometer-coded signals for their respective cells. The digital circuits DC1 to DCn in FIG. 3 may, for example, consist only of respective such local decoders, the global decoder being external to these digital circuits DC1 to DCn. Further details of two-stage thermometer-decoding may be found, for example, in our co-pending United Kingdom patent application no. 9800384.1, the content of which is incorporated herein by reference.

Figure 9:
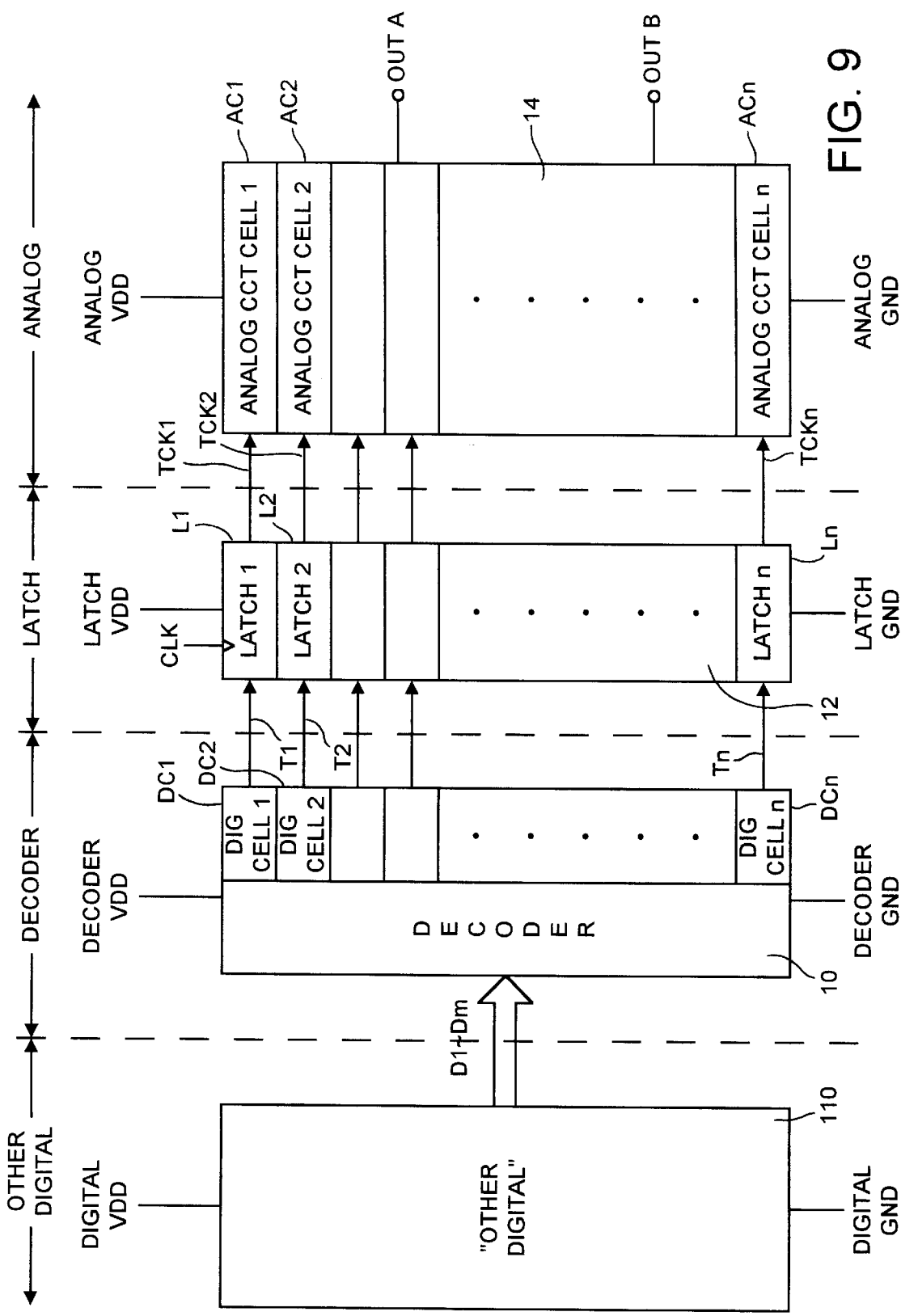
FIG. 9 shows parts of another DAC IC embodying the present invention.

FIG. 9 shows a modification of the FIG. 3 circuitry aimed at further improving the power supply isolation between different sections of a DAC IC. In the FIG. 9 modification, the circuitry is divided up into four different sections, namely analog, latch, decoder and "other digital" sections. Each section has its own independent VDD and GND supplies. In this way, the decoder circuitry has its own power supplies separate from the power supplies of the remaining parts 110 of the digital circuitry included on the DAC chip. Thus, changes in the decoder-section power supplies, caused by rapid simultaneous switching of multiple gates in the decoder section, are isolated from the substrate, "cleaning it up". Also, the decoder section can serve to physically separate the noisy "other digital" section from the more sensitive analog and latch sections.

The FIG. 9 modification can readily be applied to any of the layouts described previously with reference to FIGS. 4 to 6. For example, in the case of the FIG. 4 embodiment, it is simply necessary to add a further "triple-well" section between the digital section and the latch section, the further section having a configuration identical to the latch section in FIG. 4 but having its P-well connected to the decoder-section ground DECODER GND and having its N-well connected to the decoder-section positive supply DECODER VDD. Corresponding modifications are possible to the FIGS. 6 and 7 embodiments simply by dividing the substrate 40 are into four regions instead of the original three.

Figure 10:
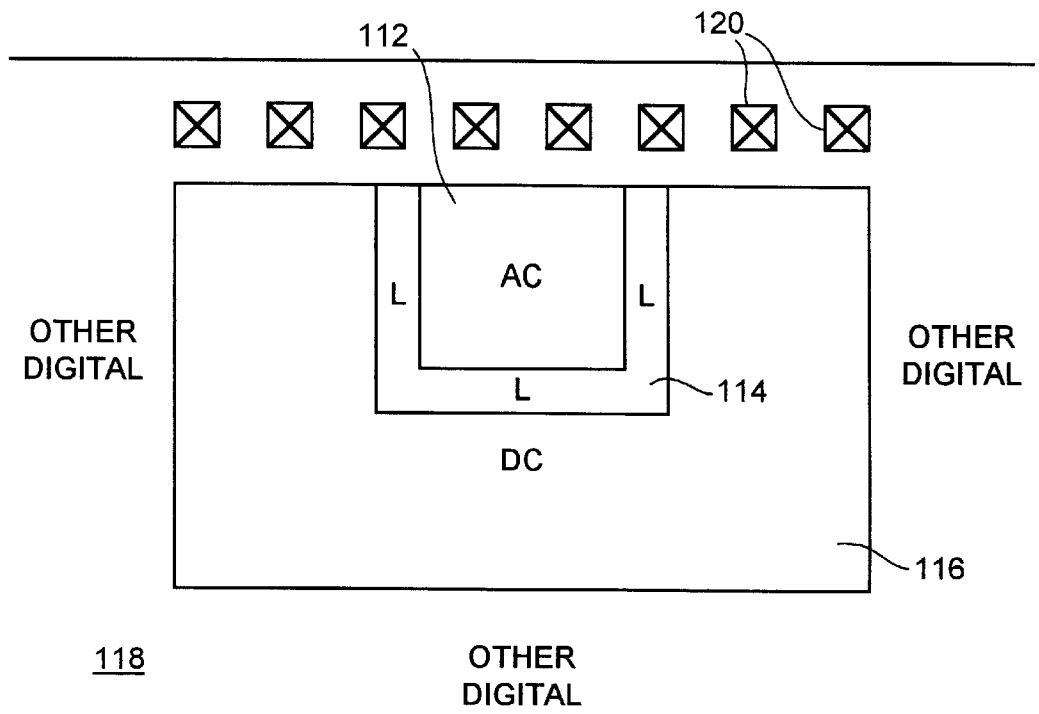
FIG. 10 shows a schematic plan view for illustrating a possible circuit layout of the FIG. 9 DAC IC.

FIG. 10 shows a schematic plan view of parts of a DAC chip for illustrating one possible layout of the sections of the DAC IC of FIG. 9. As shown in FIG. 10, the analog circuits AC are arranged in a square or rectangular area 112. Around three sides of the area 112 the latch circuits L are arranged in a U-shaped area 114. As mentioned previously, the latch circuits are advantageously of simple construction (employing few gates) so that the area 114 occupied thereby can be desirably small.

Outside the U-shaped area 114 the digital circuits DC are arranged in a further U-shaped area 116. Outside this area 116, the remaining digital circuitry of the DAC chip ("other digital") is arranged in an area 118. Contacts 120 are used to connect parts of the circuitry to external connection pins of the chip (not shown).

Figure 11:
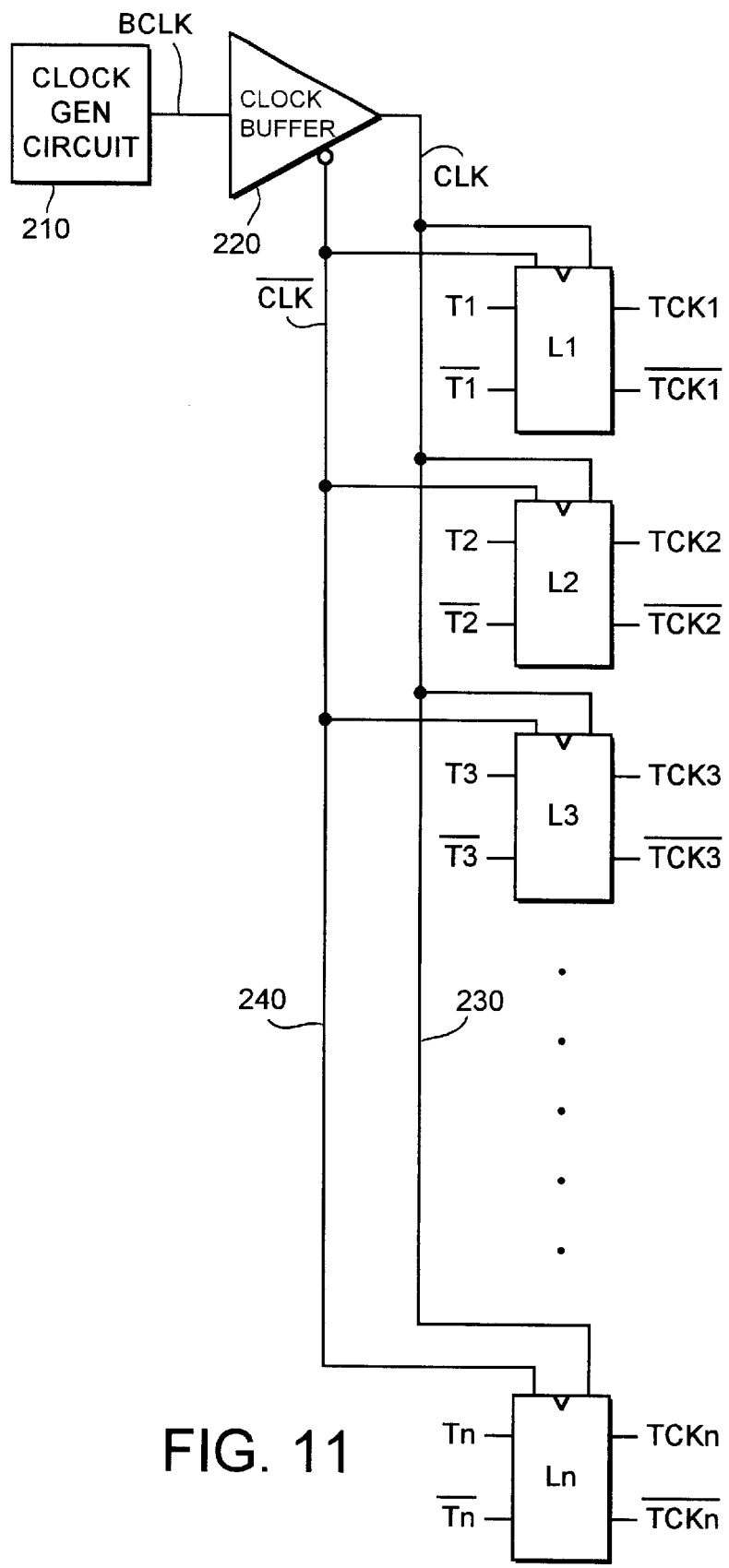
FIG. 11 shows a block circuit diagram of a first example of signal control circuitry for use in an embodiment of the present invention.

FIG. 11 is a block circuit diagram showing one possible implementation of the latch section of the FIG. 3 circuitry. In this implementation, a clock generator circuit 210 is connected to a single clock buffer circuit 220 for applying thereto a basic clock signal BCLK. The clock buffer 220 has respective noninverting and inverting outputs at which complementary clock signals CLK and $\overline{\text{CLK}}$ are produced when the circuitry is in use.

The non-inverted clock signal CLK may be produced by simply buffering the basic clock signal BCLK, and the inverted clock signal $\overline{\text{CLK}}$ may be produced by inverting and buffering the basic clock signal BCLK. It would also be possible for the clock buffer 220 to have a frequency-dividing function such that, for example, the complementary clock signals CLK and $\overline{\text{CLK}}$ are of half the frequency of the basic clock signal BCLK. In this case, the clock buffer 220 could be implemented by a D-type flip-flop whose inverting output is coupled back to its data input, the basic clock signal BCLK being applied to the clock input of the flip-flop and the required non-inverting and inverting clock signals CLK and $\overline{\text{CLK}}$ being produced at the non-inverting and inverting outputs of the flipflop respectively.

The complementary clock signals CLK and $\overline{\text{CLK}}$ are distributed via distribution lines 230 and 240 respectively to the clock inputs of the latch circuits L1 to Ln. These latch circuits L1 to Ln can each have the configuration shown in FIG. 8A, except that the inverter 80 shown in FIG. 8A is not required as the inverted clock signal $\overline{\text{CLK}}$ is generated by the clock buffer 220 in this example.

It has been determined by the present inventors that the clock distribution arrangement shown in FIG. 11 does not always operate satisfactorily in demanding applications in that data-dependent jitter is present in the output thermometer signals TCK1 to TCKn and $\overline{\text{TCK1}}$ to $\overline{\text{TCKn}}$.

Figure 12:
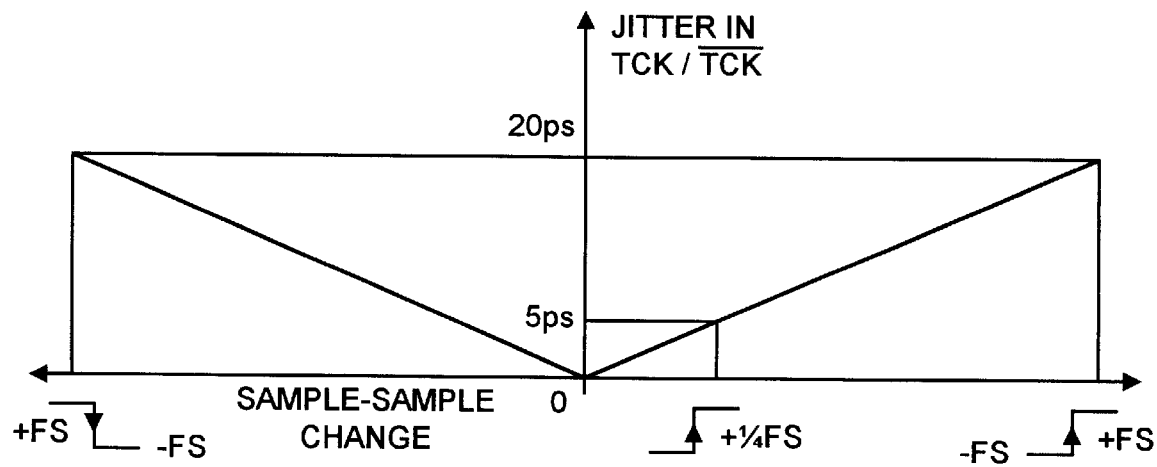
FIG. 12 shows a graph illustrating jitter in the FIG. 11 signal control circuitry.

FIG. 12 shows the variation in the jitter for different sample-sample changes in the input code D1~Dm applied to the decoder 10 in FIG. 3. When the input code is unchanged from one sample to the next (i.e. the input word D1~Dm is the same before and after a cycle of the basic clock signal BCLK), there is negligible jitter in the output thermometer signals TCK, $\overline{\text{TCK}}$. However, when the input word changes from one cycle to the next, it is observed that the amount of jitter increases in approximate proportion to the size of the sample-sample change. The maximum such sample-sample change occurs either when the input word changes from its negative full-scale value −FS to its positive full-scale value +FS or vice versa. In this case, the jitter can be as much as 20ps. For smaller changes in the input word the jitter is reduced proportionally. For example, when the input word increases by an amount equal to one quarter of the full-scale value FS (e.g. when the input word changes from +½ FS to +¾ FS) the observed jitter is approximately 5 ps.

The reason for the jitter varying according to the size of the sample-sample change is that the loading of the clock signals CLK and $\overline{\text{CLK}}$ produced by the clock buffer 220 is dependent upon the number of latch circuits L1 to Ln which change their state from one clock cycle to the next. When the input word is the same from one clock cycle to the next, none of the latch circuits changes its state so that the loading on the clock signals CLK and $\overline{\text{CLK}}$ is minimal. When, on the other hand, the input word changes, some of the latch circuits L1 to Ln must change their state from one clock cycle to the next, and the greater the number of latch circuits that change state the greater the loading imposed on the clock signals CLK and $\overline{\text{CLK}}$.

Although it might be considered that an adequate solution to this problem would simply be to increase the size of the output transistors in the clock buffer 220, so as to provide a greater load-driving capability, such a solution is not satisfactory in practice. For one thing, the current consumption of the clock buffer 220 is then increased, resulting in the coupling of additional noise into the latch circuit power supplies LATCH VDD and LATCH GND which inevitably cross-couples into the sensitive analog power supplies ANALOG VDD and ANALOG GND. Also, as the heavily-loaded distribution lines 230 and 240 are relatively long and accordingly have a relatively high parasitic capacitance, there is inevitably a skewing of the clock signals delivered to the different latch circuits from the clock buffer 220.

Figure 13:
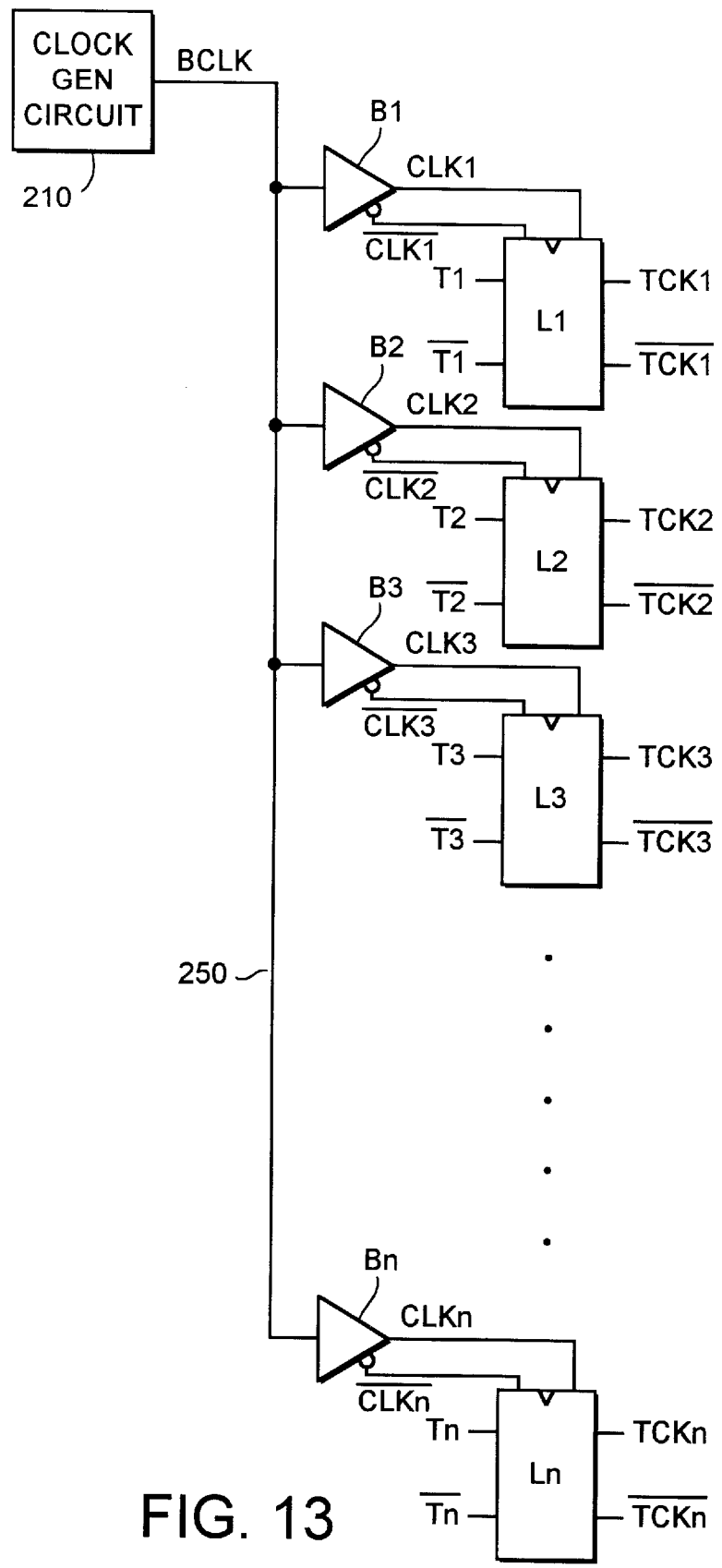
FIG. 13 shows a block circuit diagram of a second example of signal control circuitry for use in an embodiment of the present invention.

A preferred solution to the jitter problem described with reference to FIGS. 11 and 12 is shown in FIG. 13. In FIG. 13, the clock buffer 220 is replaced by an array of clock buffers E1 to Bn corresponding respectively to the latch circuits L1 to Ln. Each buffer circuit B1 to Bn receives at its input the basic clock signal BCLK produced by the clock generator circuit 210 and produces at respective noninverting and converting outputs thereof complementary clock signals CLK and $\overline{\text{CLK}}$ unique to its corresponding latch circuit. Each buffer circuit can therefore have the same basic configuration as the clock buffer 220 of FIG. 11, but as each buffer circuit B1 to Bn only has to drive one latch circuit the size of the output transistors thereof can be much smaller than in the clock buffer 220 of FIG. 11.

Because each latch circuit L1 to Ln has its own buffer circuit B1 to Bn interposed between it and the clock generator circuit 210, the clock distribution line 250 which links the clock generator circuit 210 to the buffer circuits B1 to Bn is affected much less by changes in state of the latch circuits than the corresponding clock distribution lines 230 and 240 in FIG. 11. Accordingly, the amount of jitter is reduced remarkably, for example to under 2 ps for any sample-sample change in the input word.

It is also possible to use two clock distribution lines to distribute mutually-complementary basic clock signals BCLK and $\overline{\text{BCLK}}$ to the buffer circuits, in which case each buffer circuit simply has respective inverters for deriving the required complementary "local" clock signals CLK and $\overline{\text{CLK}}$ from the basic clock signals. This has the advantage that the clock distribution lines undergo complementary changes so that the substrate (to which the two clock distribution lines are capacitatively coupled) is affected less by clock-signal changes.

It will be understood by those skilled in the art that, in order to improve on the jitter performance shown in FIG. 12, it is not necessary for every latch circuit to be provided with its own buffer circuit as in FIG. 13. For example, it would be possible for two or more latch circuits (e.g. adjacent latch circuits L1 and L2) to share the same buffer circuit B, enabling the total number of buffer circuits to be reduced. In this case, however, some data-dependent jitter will inevitably remain. For example, there will be some input-word changes which result in both the latch circuits L1 and L2 changing state (high loading), and other input-word changes for which only one or none of them changes state (medium or low loading). Because of these different loading possibilities amongst latch circuits that share a common buffer circuit, jitter (albeit at a lower level than in FIG. 12) will exist.

Figure 14:
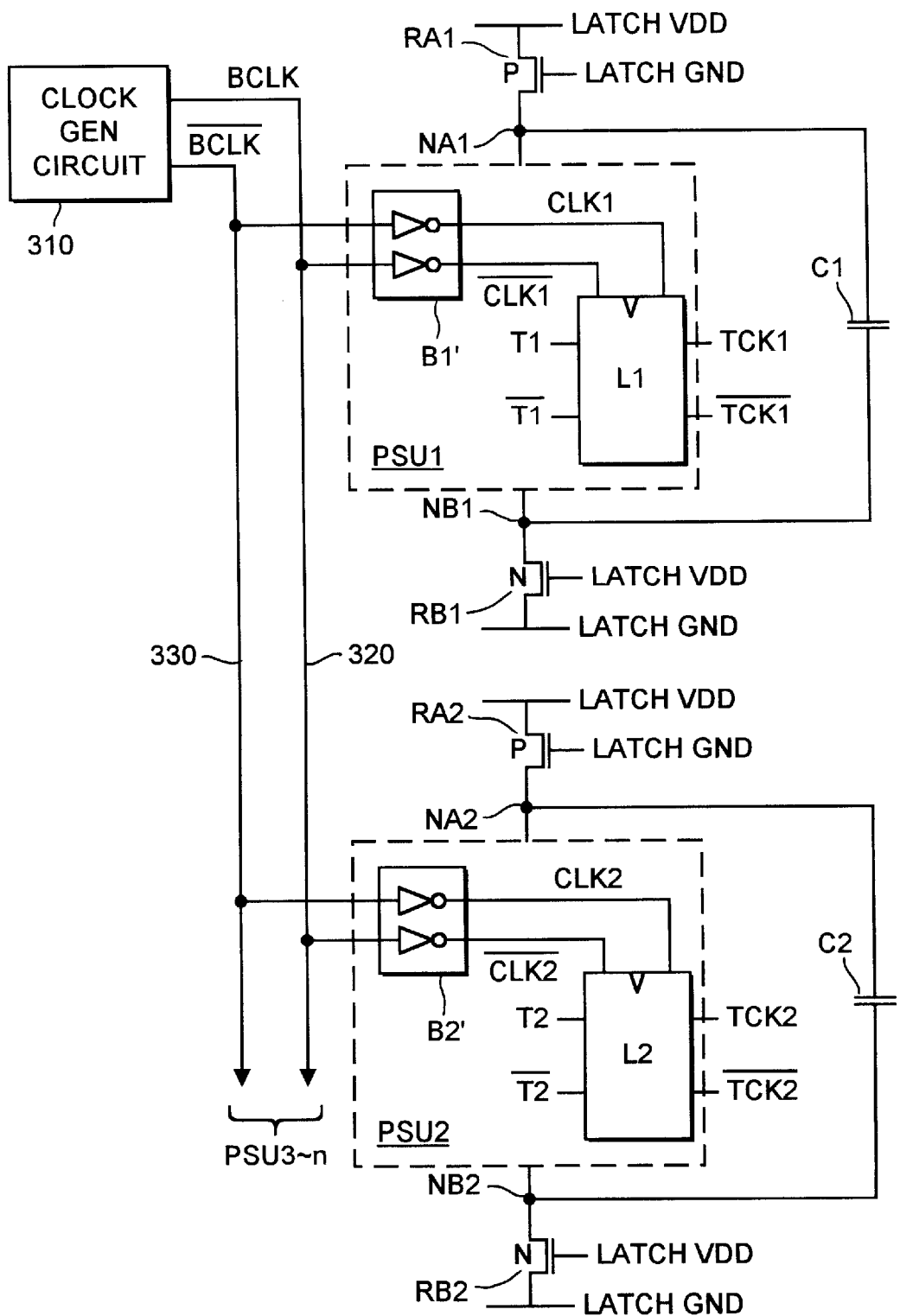
FIG. 14 shows a block circuit diagram of parts of signal control circuitry used in another embodiment of the present invention.

It has also been determined by the present inventors that, although the FIG. 13 signal control circuitry is effective in reducing jitter arising from loading of the clock distribution line or lines, further jitter arises from the fact that the load on the power supplies of the signal control circuitry is dependent upon the step size from one clock cycle to the next, i.e. is dependent on the number of latch circuits L1 to Ln which change state from one clock cycle to the next. To address this problem, as shown in FIG. 14, the signal control circuitry is divided up into n individual units PSUL to PSUn for power supply purposes. Each unit PSU is made up of a clock buffer circuit B' and a latch circuit L.

In this embodiment a clock generator circuit 310 serves to generate mutually-complementary basic clock signals BCLK and $\overline{\text{BCLK}}$ which are distributed by different respective clock distribution lines 320 to 330 to each of the different clock buffer circuits B1' to Bn'. Each clock buffer circuit B' accordingly comprises two inverters for producing the required "local" mutually-complementary clock signals for application to its associated latch circuit L.

In the FIG. 14 embodiment, the VDD and GND supplies for the different units PSUL to PSUn are decoupled from one another using first and second resistors RA and RB and a capacitor C. The resistor RA connects a first power supply node NA of its unit PSU to a main positive supply line LATCH VDD of the signal control circuitry. This first power supply node NA is connected within the unit PSU to the VDD connection terminals of the clock buffer circuit B' and the latch circuit L of that unit. Similarly, the resistor RB connects a second power supply node NB of its unit PSU to a main electrical ground line LATCH GND of the signal control circuitry. This second power supply node NB is connected within the unit PSU to the GND connection terminals of the buffer circuit B' and the latch circuit L of the unit PSU concerned. The capacitor C is connected between the two nodes NA and NB.

In this embodiment, as shown in FIG. 14 itself the resistor RA is constituted by a PMOS transistor whose source is connected to the main positive supply line LATCH VDD and whose drain is connected to the node NA. The gate of the PMOS transistor is connected to LATCH GND. The resistor RB is formed by an NMOS transistor whose source is connected to the main electrical ground line LATCH GND and whose drain is connected to the node NB. The gate of the NMOS transistor is connected to LATCH VDD. The reason for connecting the transistor gates to LATCH GND and LATCH VDD respectively is to cause the resistances of the transistors to track changes in the power supply voltages LATCH VDD and LATCH GND. If the potential difference between these two supply lines increases, the transistors turn on more strongly, reducing their respective resistances.

It is preferable to match the sizes of the transistors used to provide the resistors RA and RB to the sizes of the transistors included in the circuitry (i.e. the buffer circuit B' and latch circuit L) of an individual one of the units PSU. For example, the size of each of the transistors used to provide RA and RB may be made equal to the total size of the transistors in the buffer circuit and latch circuit of an individual unit PSU.

The power supply decoupling idea described above with reference to FIG. 14 can also be applied advantageously to the FIG. 11 embodiment. In this case, as the different latch circuits do not have respective clock buffer circuits, each individual unit PSU for power supply purposes is constituted simply by one of the latch circuits L1 to Ln alone. Similarly, when two or more latch circuits share the same clock buffer circuit (a further possibility mentioned above) a unit PSU for power supply purposes could be formed by those two or more latch circuits together with the common buffer circuit which applies clock signals to those latch circuits.

It is not essential in any of the foregoing embodiments that the digital circuitry (10 in FIG. 3) produces thermometer-coded signals. The analog circuits could, for example, be selected individually in accordance with the digital signals produced by the digital circuitry, rather than combinatorially as in the case in which thermometer-coded signals are used. Thus, the digital signals produced by the digital circuitry could be mutually-exclusive selection signals.

The measures described in relation to the foregoing embodiments are applicable in any situation in which sensitive analog circuits must be capable of undergoing respective predetermined operations at a single well-defined instant in time, or even at respective staggered (but well-defined) instants in time.

What is claimed is:

1. A mixed-signal integrated circuit device comprising:
   digital circuitry producing one or more first digital signals;
   analog circuitry having a plurality of inputs receiving respective second digital signals and producing one or more analog signals in dependence upon the received second digital signals; and
   signal control circuitry connected to said digital circuitry and said analog circuitry deriving said second digital signals from said first digital signals and controlling a timing of application of said second digital signals to said plurality of inputs,
   wherein power is supplied independently to each of said digital circuitry, said analog circuitry, and said signal control circiutry.

2. A device as claimed in claim 1, wherein each of said digital circuitry, said analog circuitry, and said signal control circuitry is provided with at least one power supply connection path, extending within the device between that circuitry and a power supply terminal of the device, that is independent of said at least one power supply connection path of each other one said digital circuitry, said analog circuitry, and said signal control circiutry.

3. A device as claimed in claim 1, wherein said digital circuitry, said signal control circuitry and said analog circuitry are formed in first, second and third areas of the device, respectively, at least part of said second area located between said first and third areas.

4. A device as claimed in claim 3, wherein said second area extends around two or more edges of said third area.

5. A device as claimed in claim 3, wherein said second area is smaller than said first area.

6. A device as claimed in claim 3, wherein said second and third areas are close together.

7. A device as claimed in claim 3, wherein said second area is further from said first area than from said third area.

8. A device as claimed in claim 1, having a semiconductor substrate of one conductivity type, wherein:

each said circuitry has respective first and second wells formed in said substrate, said first well being of said one conductivity type and said second well being of a second conductivity type;

said first and second wells of said digital circuitry are located side-by-side in said substrate and a first power supply line of the digital circuitry is connected to said substrate;

for each of said signal control circuitry and said analog circuitry, said first well is contained within said second well and is connected to a first power supply line of the signal control circuitry and the analog circuitry; and for each said signal control circuitry and said analog control circuitry, said second well is connected to a second power supply line of the signal control circuitry and the analog circuitry.

9. A device as claimed in claim 8, wherein said one conductivity type is p-type, and said first and second power supply lines of each said circuitry are ground potential and a predetermined positive potential, respectively.

10. A device as claimed in claim 1, having a semiconductor substrate of one conductivity type and also having, below the substrate surface, a layer of insulating material, wherein:

said substrate is divided by an isolation unit, extending between said substrate surface and said layer of insulating material, into respective first, second and third substrate regions corresponding respectively to said digital circuitry, said signal control circuitry portion and said analog circuitry;

each said substrate region has first and second wells formed side-by-side therein, the first well being of said one conductivity type and said second well being of a second conductivity type; and for each said circuitry, a first power supply line of the respective circuitry is connected to said substrate region corresponding to that circuitry and a second power supply line of the respective circuitry is connected to said second well of said substrate region corresponding to that circuitry.

11. A device as claimed in claim 10, wherein said layer of insulating material is an oxygen-implanted layer.

12. A device as claimed in claim 10, wherein said layer of insulating material is formed on one main face of a device wafer, which wafer is bonded to a backing wafer such that said layer is sandwiched therebetween.

13. A device as claimed in claim 10, wherein said isolation unit includes a trench of insulating material between two mutually-adjacent ones of said substrate regions.

14. A device as claimed in claim 10, wherein said isolation unit includes a well of said second conductivity type extending between two mutually-adjacent ones of said substrate regions.

15. A device as claimed in claim 14, wherein said well of the isolation unit is one of said second wells.

16. A device as claimed in claim 10, wherein said one conductivity type is p-type, and said first and second power supply lines of each said circuitry are ground potential and a predetermined positive potential, respectively.

17. A device as claimed in claim 1, wherein said digital circuitry comprises decoder circuitry deriving said first digital signals from a digital code word applied thereto; and further comprising:

additional circuitry carrying out other digital signal processing, said power supply supplying power independently to said additional circuitry and said decoder circuitry.

18. A device as claimed in claim 1, wherein said signal control circuitry simultaneously applies said second digital signals to their respective said inputs.

19. A device as claimed in claim 1, wherein said first digital signals and/or said second digital signals include thermometer-coded signals.

20. A device as claimed in claim 1, wherein said first digital signals and/or said second digital signals include complementary-signal-pairs.

21. A device as claimed in claim 1, wherein said signal control circuitry further comprises:

a plurality of individual clocked circuits, each receiving one or more of said first digital signals and each also receiving a first clock signal, and deriving from said one or more first digital signals at least one of said second digital signals and applying the second digital signal to said input of analog circuitry at a time determined by said first clock signal received thereby.

22. A device as claimed in claim 21, wherein each said clocked circuit includes a latch circuit.

23. A device as claimed in claim 21, wherein said signal control circuitry further comprises:

clock distribution circuitry including a plurality of individual clock buffer circuits receiving in common a basic timing signal, each said clock buffer circuit deriving from the basic timing signal, one of said first clock signals applied to one or more corresponding ones of said plurality of clocked circuits.

24. A device as claimed in claim 23, wherein each of said plurality of clocked circuits has its own individually-corresponding clock buffer circuit for deriving one of said first clock signals applied to its respective clocked circuit.

25. A device as claimed in claim 23, wherein each said clock buffer circuit has respective non-inverting and inverting outputs for applying respective mutually-complementary clock signals to said corresponding clocked circuits.

26. A device as claimed in claim 23, wherein each said clock buffer circuit has respective first and second inputs for receiving mutually-complementary basic timing signals from which the clock buffer circuit derives said first clock signal.

27. A device as claimed in claim 1, wherein said device includes a digital-to-analog converter.

28. A device as claimed in claim 27, wherein the analog circuitry includes a plurality of current sources or current sinks and a plurality of switch circuits connected to the current sources or the current sinks performing predetermined switching operations in dependence upon said second digital signals to produce said one or more analog signals.

29. Mixed-signal circuitry including:

digital producing one or more first digital signals;

analog circuitry having a plurality of inputs receiving respective second digital signals and producing one or more analog signals in dependence upon the received second digital signals; and signal control circuitry, interposed between said digital circuitry and said analog circuitry, comprising:

a plurality of individual clocked circuits, each receiving one or more of said first digital signals and a first clock signal and deriving from each of the received first digital signals at least one corresponding second digital signal and applying the corresponding second digital signal to said analog-circuitry input at a time determined by the received first clock signal; and clock distribution circuitry including a plurality of clock buffer circuits receiving a basic timing signal, each of said plurality of clock buffer circuits deriving from the basic timing signal one of said first clock signals applied to one or more corresponding ones of said plurality of clocked circuits.

30. Mixed-signal circuitry as claimed in claim 29, wherein each clocked circuit has its own individually corresponding clock buffer circuit deriving one of said first clock signals applied to said corresponding clocked circuit.

31. Mixed-signal circuitry as claimed in claim 29, wherein each said clock buffer circuit has respective non-inverting and inverting outputs applying respective mutually-complementary clock signals to said corresponding clocked circuits.

32. Mixed-signal circuitry as claimed in claim 29, wherein each said clock buffer circuit has respective first and second inputs receiving mutually-complementary basic timing signals from which the clock buffer circuit derives said first clock signal.

33. Mixed-signal circuitry as claimed in claim 29, wherein said signal control circuitry simultaneously applies said second digital signals to their respective said inputs.

34. Mixed-signal circuitry as claimed in claim 29, wherein said first digital signals and/or said second digital signals include thermometer-coded signals.

35. Mixed-signal circuitry as claimed in claim 29, wherein said first digital signals and/or said second digital signals include complementary-signal-pairs.

36. Mixed-signal circuitry as claimed in claim 29, wherein said clocked circuits are respective latch circuits.

37. Mixed-signal circuitry as claimed in claim 29, wherein said mixed-signal circuitry includes a digital-to-analog converter.

38. Mixed-signal circuitry as claimed in claim 37, wherein the analog circuitry includes a plurality of current sources or current sinks and a plurality of switch circuits connected to the current sources or the current sinks performing predetermined switching operations in dependence upon said second digital signals to produce said one or more analog signals.

39. Mixed-signal circuitry comprising:

digital circuitry producing one or more first digital signals;

analog circuitry having a plurality of inputs receiving respective second digital signals and producing one or more analog signals in dependence upon the received second digital signals; and signal control circuitry, interposed between said digital circuitry and said analog circuitry, comprising:

a plurality of individual clocked circuits, each receiving one or more of said first digital signals and a first clock signal and deriving from said one or more first digital signals at least one corresponding second digital signal applying the corresponding second digital signal to said analog-circuitry input at a time determined by the received first clock signal, and power supply decoupling circuitry dividing said plurality of clocked circuits into a plurality of units, each unit having at least one of said plurality of clocked circuits, said power supply decoupling circuitry decoupling respective power supplies of the plurality of units from one another.

40. Circuitry as claimed in claim 39, wherein said signal control circuitry further comprises:

clock distribution circuitry including a plurality of individual clock buffer circuits receiving a basic timing signal, each of said plurality of clock buffer circuits deriving from the basic timing signal one of said first clock signals applied to one or more corresponding ones of said plurality of clocked circuits; and each of said said plurality of units is constituted by said clock buffer circuit and its said one or more corresponding clocked circuits.

41. Circuitry as claimed in claim 40, wherein each said clocked circuit has its own individually-corresponding clock buffer circuit deriving one of said first clock signals applied to said corresponding clocked circuit.

42. Circuitry as claimed in claim 41, wherein each said clock buffer circuit has respective non-inverting and inverting outputs for applying respective mutually-complementary said first clock signals to said one or more corresponding clocked circuits.

43. Circuitry as claimed in claim 41, wherein each said clock buffer circuit has respective first and second inputs receiving mutually-complementary said basic timing signals from which the clocked circuit derives said first clock signal.

44. Circuitry as claimed in claim 39, wherein said power supply decoupling circuitry for each of said plurality of units comprises:

a first resistance element connecting a main positive power supply line of the signal control circuitry to a first node of the unit, to which first node respective power supply connection terminals of said at least one clocked circuit of said unit are connected;

a second resistance element connecting a main negative power supply line of the signal control circuitry to a second node of the unit, to which second node respective negative power supply connection terminals of said at least one clocked circuit of said unit are connected; and a capacitance element connected between said first and second nodes.

45. Circuitry as claimed in claim 44, wherein said first resistance element is provided by a P-type field effect transistor having a source connected to said main positive power supply line and a drain connected to said first node.

46. Circuitry as claimed in claim 45, wherein a gate of said P-type field-effect transistor is connected to said main negative power supply line.

47. Circuitry as claimed in claim 45, wherein in each said unit a size of the P-type field-effect transistor is similar to a sum of the respective sizes of all of the transistors of said at least one clocked circuit in that unit.

48. Circuitry as claimed in claim 44, wherein said second resistance element is provided by an N-type field-effect transistor having a source connected to said main negative power supply line and a drain connected to said second node.

49. Circuitry as claimed in claim 48, wherein a gate of said N-type field-effect transistor is connected to said main positive power supply line.

50. Circuitry as claimed in claim 48, wherein in each said unit size of said N-type field-effect transistor is similar to a sum of the respective sizes of all of the transistors of said at least one clocked circuit in that unit.

51. Circuitry as claimed in claim 39, wherein said mixed signal circuitry includes a digital-to-analog converter.

52. Circuitry as claimed in claim 51, wherein the analog circuitry includes a plurality of current sources or current sinks and a plurality of switch circuits connected to the current sources or current sinks performing predetermined switching operations in dependence upon said second digital signals to produce said one or more analog signals.

53. An apparatus comprising:

digital circuitry means for producing one or more first digital signals;

analog circuitry means, having a plurality of inputs receiving respective second digital signals, for producing one or more analog signals dependent upon the received second digital signals;

signal control circuitry means, connected to said digital circuitry means and said analog circuitry means, for deriving said second digital signals from said first digital signals and for controlling a timing of application of said second digital signals to said plurality of inputs; and a power supply means for supplying power independently to each of said digital circuitry means, said analog circuitry means, and said signal control circuitry means.

54. Mixed-signal circuitry comprising:

digital circuitry means for producing one or more first digital signals;

analog circuitry means, having a plurality of inputs receiving respective second digital signals, for producing one or more analog signals in dependence upon the received second digital signals; and signal control circuitry means, interposed between said digital circuitry means and said analog circuitry means, for comprising a plurality of individual clocked circuits, each receiving one or more of said first digital signals and a first clock signal and deriving from said one or more first digital signals at least one corresponding second digital signal and applying the corresponding second digital signal to said analog-circuitry input at a time determined by the received first clock signal, and a power supply decoupling means for dividing said plurality of clocked circuits into a plurality of units, each unit having at least one of said plurality of clocked circuits, and for decoupling respective power supplies of the plurality of units from one another.

55. A mixed-signal integrated circuit device comprising:

digital circuitry;

analog circuitry; and clock distribution circuitry distribution clock signals within the device, wherein power is supplied independently to each of said digital circuitry, said analog circuitry, and said clock distribution circuitry.

56. An apparatus comprising:

digital circuitry producing one or more first digital signals;

analog circuitry having a plurality of inputs receiving respective second digital signals, and producing one or more analog signals dependent upon the received second digital signals; and signal control circuitry comprising
a plurality of clocked circuits each receiving a first clock signal, and
clock distribution circuitry including a plurality of clock buffer circuits, wherein each of said plurality of clock buffer circuits derives, from a basic timing signal, one said first clock signal applied to one or more corresponding ones of said plurality of clocked circuits.

57. An apparatus comprising:

digital circuitry producing one or more first digital signals;

analog circuitry having a plurality of inputs receiving respective second digital signals, and producing one or more analog signals dependent upon the received second digital signals; and signal control circuitry comprising
a plurality of clocked circuits individually receiving a clock signal, and
a power supply circuit dividing said plurality of clocked circuits into a plurality of units, each of said plurality of units having at least one of said plurality of clocked circuits, and decoupling the respective power supplies of the said plurality of units from one another.

* * * * *